United States Patent
Kärkkäinen et al.

(10) Patent No.: US 10,461,773 B2
(45) Date of Patent: Oct. 29, 2019

(54) ENCODER, DECODER AND METHOD

(71) Applicant: Gurulogic Microsystems Oy, Turku (FI)

(72) Inventors: Toumas Kärkkäinen, Turku (FI); Ossi Kalevo, Akaa (FI)

(73) Assignee: GURULOGIC MICROSYSTEMS OY, Turku (FI)

( * ) Notice: Subject to any disclaimer, the term of this patent is extended or adjusted under 35 U.S.C. 154(b) by 0 days.

(21) Appl. No.: 15/332,291

(22) Filed: Oct. 24, 2016

(65) Prior Publication Data

US 2017/0041021 A1 Feb. 9, 2017

Related U.S. Application Data

(63) Continuation of application No. PCT/EP2015/025022, filed on Apr. 27, 2015.

(30) Foreign Application Priority Data

Apr. 27, 2014 (GB) .................... 1407375.3

(51) Int. Cl.
*H03M 7/00* (2006.01)
*H03M 7/30* (2006.01)
*H03M 13/09* (2006.01)

(52) U.S. Cl.
CPC ....... *H03M 7/3084* (2013.01); *H03M 7/6005* (2013.01); *H03M 7/6011* (2013.01); *H03M 7/6041* (2013.01); *H03M 13/09* (2013.01)

(58) Field of Classification Search
CPC .......... H03M 13/373; H03M 13/3746; H03M 13/3761; H03M 13/1191; H03M 13/15; H03M 13/47; H03M 7/3084; H03M 7/40; G06F 16/2264; G06F 16/24561; G06F 16/283

(Continued)

(56) References Cited

U.S. PATENT DOCUMENTS 5,974,179 A 10/1999 Caklovic
6,292,115 B1 * 9/2001 Heath ................ H03M 7/3086
341/51

(Continued)

FOREIGN PATENT DOCUMENTS

EP 2348690 A2 7/2011

OTHER PUBLICATIONS

Examination Report under Section 18(3) issued by the United Kingdom Intellectual Property Office in relation to GB1407375.3 dated Feb. 9, 2017 (3 pages).
Examination Report under Section 18(3) issued by the United Kingdom Intellectual Property Office in relation to GB1407375.3 dated Apr. 19, 2016 (3 pages).
Examination Report under Section 18(3) issued by the United Kingdom Intellectual Property Office in relation to GB1407375.3 dated Jul. 20, 2015 (3 pages).

(Continued)

*Primary Examiner* — Linh V Nguyen
(74) *Attorney, Agent, or Firm* — Robert P. Michal, Esq.; Carter, DeLuca & Farrell LLP

(57) ABSTRACT

An encoder for compressing input data to generate corresponding encoded data is provided. The encoder is operable to process the input data to identify reoccurrence of mutually similar multi-dimensional patterns of data bits and/or data symbols therein. The encoder is then operable to represent one or more duplicate reoccurrences of the mutually similar multi-dimensional patterns of data bits and/or data symbols by way of one or more duplication symbols uniquely identifying the mutually similar patterns.

28 Claims, 9 Drawing Sheets

(58) Field of Classification Search
USPC .................................. 341/51, 65, 67, 87, 106
See application file for complete search history.

(56) References Cited

U.S. PATENT DOCUMENTS

| | | | | |
|---|---|---|---|---|
| 7,155,062 | B1* | 12/2006 | Stoica | H04N 1/4115 382/232 |
| 8,175,403 | B1* | 5/2012 | Alakuijala | H03M 7/3097 382/246 |
| 8,213,729 | B2* | 7/2012 | Kajiwara | H04N 1/64 382/233 |
| 9,613,292 | B1* | 4/2017 | El Defrawy | G06K 9/6201 |
| 2007/0071320 | A1* | 3/2007 | Yada | G06K 7/14 382/181 |
| 2008/0114793 | A1* | 5/2008 | Grosset | G06F 16/24561 |
| 2008/0154928 | A1* | 6/2008 | Bashyam | H03M 7/30 |
| 2009/0045987 | A1* | 2/2009 | Cho | H03M 7/30 341/50 |
| 2009/0315744 | A1 | 12/2009 | Burukhin et al. | |
| 2010/0013679 | A1* | 1/2010 | Tung | H03M 7/425 341/65 |
| 2010/0225506 | A1* | 9/2010 | Chen | H03M 7/3086 341/51 |
| 2011/0043387 | A1 | 2/2011 | Abell et al. | |
| 2011/0179341 | A1 | 7/2011 | Falls et al. | |
| 2013/0106627 | A1* | 5/2013 | Cideciyan | H03M 7/4043 341/65 |
| 2015/0296214 | A1* | 10/2015 | Mahfoodh | H04N 19/44 382/233 |
| 2015/0319268 | A1* | 11/2015 | Callard | H04L 65/607 709/231 |

OTHER PUBLICATIONS

Combined Search and Examination Report under Sections 17 and 18(3) issued by the United Kingdom Intellectual Property Office in relation to GB1407375.3 dated Oct. 20, 2014 (6 pages).

Written Opinion of the International Preliminary Examining Authority issued by the European Patent Office in relation to PCT/EP2015/025022 dated Jul. 22, 2015 (8 pages).

Anonymous: "Dictionary Coder", Wikipedia, the free encyclopedia, Mar. 8, 2014, pp. 1-4, XP055201976, Retrieved from the Internet: URL:http://web.archive.org/web/20140308080944/https://en.wikipedia.org/wiki/Dictionary_coder, [retrieved on Jul. 13, 2015] (4 pages).

Andreas Dehmel, "Designing a Compression Engine for Multidimensional Raster Data," In: Lecture Notes in Computer Science:, Jan. 1, 2001, Springer Berlin Heidelberg, Berlin, Heidelberg, XP055201592, ISSN: 0302-9743, ISBN: 978-3-54-045234-8, vol. 2113, pp. 470-480, DOI: 10.1007/3-540-44759-8_47, (H.C. Mayr et al. (Eds.): DEXA 2001, LNCS 2113, pp. 470-480, 2001) (11 pages).

International Search Report of the International Searching Authority, issued by the European Patent Office in relation to PCT/EP2015/025022 dated Jul. 22, 2015 (4 pages).

International Preliminary Report on Patentability issued by the European Patent Office in relation to PCT/EP2015/025022 dated Aug. 2, 2016 (8 pages).

Intention to Grant under Section 18(4) issued by the United Kingdom Intellectual Property Office in relation to GB1407375.3 dated Nov. 10, 2017 (2 pages).

Notification of Grant issued by the United Kingdom Intellectual Property Office in relation to GB1407375.3 dated Dec. 22, 2017 (2 pages).

Communication pursuant to Article 94(3) EPC issued by the European Patent Office in relation to European Application No. 15 722 452.8 dated Jan. 4, 2019 (7 pages).

* cited by examiner

ENCODER, DECODER AND METHOD

CROSS-REFERENCE TO RELATED APPLICATIONS

This application is a continuation of PCT International Patent Application No. PCT/EP2015/025022 filed Apr. 27, 2014, which claims the benefit of GB Patent Application No. 1407375.3 filed on Apr. 27, 2014, the entire disclosure of each of which is incorporated herein by reference.

TECHNICAL FIELD

The present disclosure relates generally to data compression; and more specifically, to encoders for compressing input data (D1) to generate corresponding encoded data (D2), and to decoders for decoding the encoded data (D2) to generate corresponding decoded data (D3). Moreover, the present disclosure relates to methods of compressing input data (D1) to generate corresponding encoded data (D2), and to methods of decoding the encoded data (D2) to generate corresponding decoded data (D3). Furthermore, the present disclosure also relates to computer program products comprising a non-transitory computer-readable storage medium having computer-readable instructions stored thereon, the computer-readable instructions being executable by a computerized device comprising processing hardware to execute aforementioned methods.

BACKGROUND INFORMATION

It has become a customary contemporary practice to compress data to reduce usage of resources, for example, during data storage and data communication. However, problems arise when compressed data needs to be decompressed to be used. For example, a slow process of decompression of compressed video data may render the whole process useless, as more computational power and time may be wasted during decompression as compared to that saved during data transfer.

Moreover, multi-dimensional images, videos and/or audios are gaining increasing popularity. Such content demands correspondingly more efficient encoding and decoding methods in encoders and decoders (hereinafter referred to as 'codecs') to cope with associated increased quantities of data to be communicated and stored.

However, conventional codecs have been unable to meet these demands as of now. The conventional codecs process data in a one-dimensional (1D) manner, and have not been designed to compress multi-dimensional images, videos and/or audios.

Therefore, there exists a need for such a codec for compressing multi-dimensional image, video and/or audio data that is efficient as compared to the conventional codecs.

In a published article ("*Designing a Compression Engine for Multidimensional Raster Data*"; Author: Andreas Dehmel), there is described a compression engine for compressing multidimensional raster data. The engine consists of two layers: a bottom layer that corresponds to known contemporary stream-oriented compression techniques, and a top layer that corresponds to a template for multidimensional raster data. The top layer can only operate on tiles, and does not perform any compression itself, but merely transforms the data according to a data model before passing it on to an object of the bottom layer for actual compression.

In another published article (URL: https://en.wikipedia.org/wiki/Dictionary_coder), there is described a dictionary coder that operates by searching for matches between a text to be compressed and a set of strings contained in a data structure (namely, a "dictionary") maintained by an encoder. When the encoder finds such a match, it substitutes a reference to the string's position in the data structure.

In a published European patent application EP2348690 A2 ("Methods and Apparatus for Compression and Network Transport of Data in Support of Continuous Availability of Applications"; Inventors: Patrick Terence Falls, Lyndon John Clarke, Wouter Senf; Applicant: Neverfail Group Ltd.), there are described methods and apparatus for compressing data for network transport in support of continuous availability of applications. A current instance of data is received in an input buffer. A candidate chunk of data is selected from the input buffer. A signature hash is then computed from a signature length range of data within the candidate chunk. A matching dictionary entry having a matching signature hash from a multi-tiered dictionary is identified. The matching dictionary entry identifies a location of a prior occurrence of a selected range of consecutive symbols including the signature length range of data within at least one of the current instance of data and a prior instance of data in the input buffer. A "dedupe", namely de-duplication, processed representation of the instance of data is formed, wherein a dedupe item is substituted for the selected range of consecutive symbols if the selected range is verified as recurring. The dedupe item identifies the location of the prior occurrence of the selected range in accordance with the matching dictionary entry.

SUMMARY

The present disclosure seeks to provide an encoder for compressing input data (D1) to generate corresponding encoded data (D2).

The present disclosure also seeks to provide a decoder for decoding the encoded data (D2) to generate corresponding decoded data (03).

Moreover, the present disclosure seeks to provide a method of compressing input data (D1) to generate corresponding encoded data (02).

Moreover, the present disclosure also seeks to provide a method of decoding the encoded data (02) to generate corresponding decoded data (03).

In a first aspect, embodiments of the present disclosure provide an encoder for compressing input data (D1) to generate corresponding encoded data (D2), wherein the encoder includes a data processor which is operable to divide the input data (D1) into a plurality of data blocks and/or data packets of data bits and/or data symbols, the plurality of data blocks and/or data packets including multi-dimensional patterns of data bits and/or data symbols; to process the plurality of data blocks and/or data packets to identify reoccurrence of mutually similar multi-dimensional patterns of data bits and/or data symbols in the input data (D1); and to represent one or more duplicate reoccurrences of the mutually similar multi-dimensional patterns of data bits and/or data symbols by way of one or more duplication symbols uniquely identifying the mutually similar multi-dimensional patterns, wherein a same duplication symbol is used to represent data blocks and/or data packets of data bits and/or data symbols whose corresponding redundancy checks match.

In order to identify previously-occurred multi-dimensional patterns of data bits and/or data symbols, the encoder is operable to employ one or more redundancy checks. For this purpose, the encoder is optionally operable to compute one or more redundancy-check values for at least one data block and/or data packet from amongst the plurality of data blocks and/or data packets. These redundancy-check values can be computed using one or more suitable redundancy check methods. These redundancy-check values may, for example, be hash values that are computed using one or more hash functions.

In an example, a single long redundancy-check value is calculated for at least one data block and/or data packet of data bits and/or data symbols. In another example, multiple short redundancy-check values are calculated for at least one data block and/or data packet of data bits and/or data symbols.

Optionally, the plurality of data blocks and/or data packets include data blocks and/or data packets of fixed size.

Optionally, the one or more data blocks and/or data packets of data bits and/or data symbols are represented by one or more corresponding alternative unique duplication-indicative symbols. Optionally, in this regard, the one or more corresponding unique duplication-indicative symbols are implemented as a previous data block, a previous data packet of data bits, or a constant value data block. Optionally, a data block and/or data packet of data bits is de-duplicated by using only one possible duplication alternative; for example a previous data block and/or data packet of data bits, a constant value data block and or a data packet of data bits or some other predefined data block and/or data packet of data bits is used as the only alternative for the duplication. Therefore, optionally, the duplication symbol is replaced by a true bit (namely de-duplication is used), or a false bit (de-duplication is not used). When several deduplication alternatives are used, it is then not sufficient to use only one bit to express the duplication symbol, but also other kinds of duplication symbols can be used for those alternatives. In other words, the duplication symbols in such a case are implemented by using corresponding patterns of data which they represent, to save computation effort in the encoder. Such an approach is efficient when the data to be encoded employs duplicated symbols or patterns of data which include relatively few bits. In some situations, this results in the data to be encoded remaining substantially unaltered during the process of de-duplication.

Optionally, the encoder is operable to generate the one or more duplication symbols as a decremented and/or incremented chronological sequence of duplication symbol values, wherein the sequence of duplication symbol values refers to a data file in which information describing the mutually similar multi-dimensional patterns of data bits and/or data symbols is stored. Thus, the duplication symbols can be generated in the encoder in a chronological sequence, for example either decremented and/or incremented to provide temporal information, as new duplicated data patterns are identified in the data to be encoded. This enables the duplication symbols to map in a direct manner with the data file, which is computationally efficient, and potentially enables the encoder to operate at a higher rate of encoding data than hitherto possible.

The chronological sequence of duplication symbol values is optionally stored in one or more data servers and/or data storages. These data servers and/or data storages are optionally accessible to one or more decoders that are compatible with the encoder, for subsequently decoding the encoded data (D2).

Optionally, the encoder is operable to communicate the duplication symbols embedded within the encoded data (D2). Alternatively, the encoder is optionally operable to communicate the duplication symbols as a separate data stream to that of the encoded data (D2), for example the duplication symbols are communicated via an alternative data communication channel to that employed to communicate the encoded data (D2).

Optionally, the encoder is operable to compress data corresponding to at least one of: one-or-multi-dimensional audio data, image data, video data, sensor data, economic data, measurement data, seismographic data, analog-to-digital converted data, transform coefficient data, transformed, processed or partial data, biomedical signal data, genomic measurement data, RNA data, DNA data, textural data, calendar data, mathematical data, and binary data, but not limited thereto. It will therefore be appreciated that embodiments of the present disclosure can be used very efficiently for various mutually different types of data, for example sensor data describing real physical variables.

Some examples of transformations in respect of input data, the coefficients of which are capable of being employed in the method pursuant to the disclosure, are, for example:
DCT (Discrete Cosine Transform), DFT/FFT (Discrete/Fast Fourier Transform), Hadamard, Haar, Wavelet, DST (Discrete Sine Transform), KLT (Karhunen-Loeve Transform), linear transformations, affine transformations, reflections, translations, rotations, scaling, shear, multilevel coding, ODelta coding, quantization, color space transformations, linear filters (FIR, IIR), nonlinear transforms (partial functions) and nonlinear filters (median, mode), but not limited thereto. These transformations are optionally used to process the data prior to it being employed by the method pursuant to the present disclosure.

In a second aspect, embodiments of the present disclosure provide a decoder for decoding encoded data (D2) to generate corresponding decoded data (D3), wherein the decoder is operable to identify one or more duplication symbols included in the encoded data (D2) indicative of one or more duplicate reoccurrences of mutually similar multi-dimensional patterns of data bits and/or data symbols, wherein a same duplication symbol is used to represent multi-dimensional patterns of data bits and/or data symbols whose corresponding redundancy checks match; and to replace the duplication symbols with corresponding multi-dimensional patterns of data bits and/or data symbols to generate the decoded data (D3).

Optionally, the decoder is operable to use true and false bits as the duplication symbols of the data block, when only one alternative for duplication symbol is available for the block, for example for a previous block, for a predefined block, and so forth. When the duplication symbol is a true bit, the decoder is then operable to replace the true bit with a corresponding pattern of data bits and/or data symbols to generate the decoded data (D3). When the duplication symbol is a false bit, the false bit is discarded and the encoded data is used to generate the decoded data (D3).

Optionally, the decoder is operable to fetch the duplicated multi-dimensional patterns of data bits and/or data symbols from one or more data servers and/or data storages.

Alternatively, the decoder is optionally operable to regenerate the duplicated multi-dimensional patterns of data bits and/or data symbols from corresponding mutually similar multi-dimensional patterns of data bits and/or data symbols included at least once in the encoded data (D2).

Optionally, the encoder and/or the decoder are arranged to function as elements of at least one of: a video codec, an audio codec, an image codec, and/or a data codec, but not limited thereto.

In a third aspect, embodiments of the present disclosure provide a method of compressing input data (D1) to generate corresponding encoded data (D2), wherein the method includes employing a data processor of an encoder for:

(i) dividing the input data (D1) into a plurality of data blocks and/or data packets of data bits and/or data symbols, the plurality of data blocks and/or data packets including multi-dimensional patterns of data bits and/or data symbols;

(ii) processing the plurality of data blocks and/or data packets to identify reoccurrence of mutually similar multi-dimensional patterns of data bits and/or data symbols in the input data (D1); and (iii) representing one or more duplicate reoccurrences of the mutually similar multi-dimensional patterns of data bits and/or data symbols by way of one or more duplication symbols uniquely identifying the mutually similar multi-dimensional patterns, wherein a same duplication symbol is used to represent data blocks and/or data packets of data bits and/or data symbols whose corresponding redundancy checks match.

Optionally, in the method, the plurality of data blocks and/or data packets include data blocks and/or data packets of fixed size.

Optionally, the method includes generating the one or more duplication symbols as a decremented and/or incremented chronological sequence of duplication symbol values, wherein the sequence of duplication symbol values refers to a data file in which information describing the mutually similar multi-dimensional patterns of data bits and/or data symbols is stored.

Optionally, the method includes storing the chronological sequence of duplication symbol values in one or more data servers and/or data storages. More optionally, the method includes arranging for the one or more data servers and/or data storages to be accessible to one or more decoders that are compatible with the encoder, for subsequently decoding the encoded data (D2).

Optionally, the method includes communicating the one or more duplication symbols embedded within the encoded data (D2).

Alternatively, optionally, the method includes communicating the one or more duplication symbols as a separate data stream to that of the encoded data (D2).

Optionally, the method includes compressing data corresponding to at least one of: one-or-multi-dimensional audio data, image data, video data, sensor data, economic data, measurement data, seismographic data, transform coefficient data, transformed, processed or partial data, biomedical signal data, genomic data, RNA data, DNA data.

Optionally, the method includes computing one or more redundancy-check values that are used to identify previously-occurred multi-dimensional patterns of data bits and/or data symbols.

In a fourth aspect, embodiments of the present disclosure provide a software product recorded on machine-readable non-transitory (non-transient) data storage media, wherein the software product is executable upon computing hardware for implementing the aforementioned method.

In a fifth aspect, embodiments of the present disclosure provide a method of decoding encoded data (D2) to generate corresponding decoded data (D3) wherein the method includes:

(i) identifying one or more duplication symbols included in the encoded data (D2) indicative of one or more duplicate reoccurrences of mutually similar multi-dimensional patterns of data bits and/or data symbols, wherein a same duplication symbol is used to represent multi-dimensional patterns of data bits and/or data symbols whose corresponding redundancy checks match; and (ii) replacing the one or more duplication symbols with corresponding multi-dimensional patterns of data bits and/or data symbols to generate the decoded data (D3).

Optionally, the method includes fetching the one or more duplicated multi-dimensional patterns of data bits and/or data symbols from one or more data servers and/or data storages.

Optionally, the method includes regenerating the one or more duplicated multi-dimensional patterns of data bits and/or data symbols from corresponding mutually similar multi-dimensional patterns of data bits and/or data symbols included at least once in the encoded data (D2).

In a sixth aspect, embodiments of the present disclosure provide a software product recorded on machine-readable non-transitory (non-transient) data storage media, wherein the software product is executable upon computing hardware for implementing the aforementioned method; in other words, the present disclosure provides a computer program product comprising a non-transitory computer-readable storage medium having computer-readable instructions stored thereon, the computer-readable instructions being executable by a computerized device comprising processing hardware to execute aforementioned method.

In a seventh aspect, embodiments of the present disclosure provide a codec including a combination of at least one encoder and at least one decoder pursuant to the present disclosure.

Embodiments of the present disclosure substantially eliminate, or at least partially address, the aforementioned problems in the prior art, and enable lossless or near lossless data compression of one-or-multi-dimensional image, video, audio and any type of data with a high compression ratio.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

DETAILED DESCRIPTION

Figure 1:
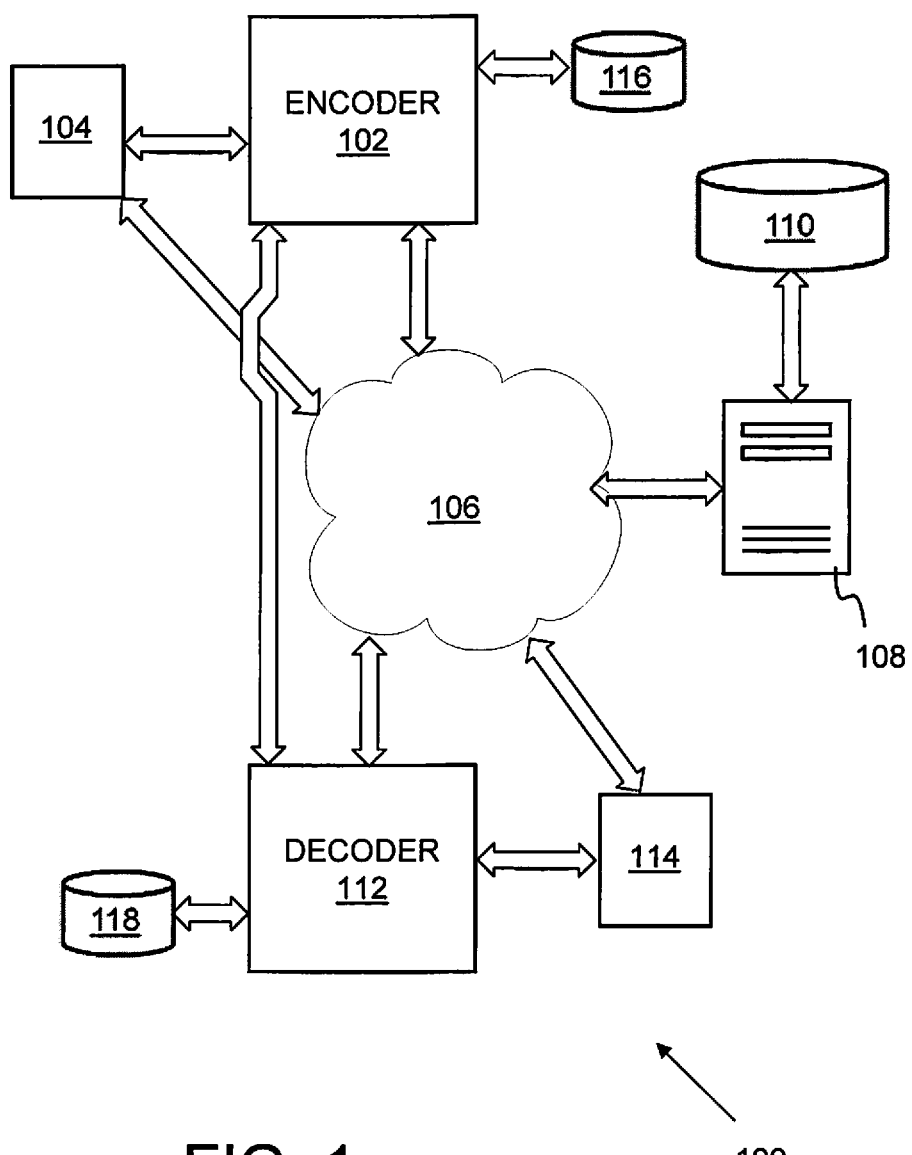
FIG. 1 is a schematic illustration of an example network environment that is suitable for practicing embodiments of the present disclosure.

The following detailed description illustrates embodiments of the present disclosure and ways in which they can be implemented. Although the best mode of carrying out the present disclosure has been disclosed, those skilled in the art would recognize that other embodiments for carrying out or practicing the present disclosure are also possible.

Embodiments of the present disclosure provide an encoder for compressing input data (D1) to generate corresponding encoded data (D2). The encoder is operable to divide the input data (D1) into a plurality of data blocks and/or data packets of data bits and/or data symbols. The encoder is then operable to process the plurality of data blocks and/or data packets to identify reoccurrence of mutually similar multi-dimensional patterns of data bits and/or data symbols in the input data (D1). The encoder is then operable to represent one or more duplicate reoccurrences of the mutually similar multi-dimensional patterns of data bits and/or data symbols by way of one or more duplication symbols uniquely identifying the mutually similar multi-dimensional patterns.

In order to identify previously-occurred patterns of data bits and/or data symbols, the encoder is optionally operable to employ one or more redundancy checks. For this purpose, the encoder is optionally operable to compute one or more redundancy-check values for at least one data block and/or data packet from amongst the plurality of data blocks and/or data packets. These redundancy-check values can be computed using one or more suitable redundancy check methods. These redundancy-check values may, for example, be hash values that are computed using one or more hash functions.

In an example, a single long redundancy-check value is calculated for at least one data block and/or data packet of data bits and/or data symbols. In another example, multiple short redundancy-check values are calculated for at least one data block and/or data packet of data bits and/or data symbols.

The encoder is then optionally operable to use a same duplication symbol to represent data blocks and/or data packets of data bits and/or data symbols whose corresponding redundancy checks match.

Optionally, the data block and/or data packet of data bits may be deduplicated by using only one possible duplication alternative; for example, the previous data block and/or data packet of data bits or some other predefined data block and/or data packet of data bits is used as the only alternative for the duplication. Therefore, optionally, the duplication symbol can then be replaced by true bit (indicative of deduplication being used) or false bit (indicative of deduplication not being used).

Optionally, the encoder is operable to generate one or more duplication symbols as a decremented and/or incremented chronological sequence of duplication symbol values referring to a data file in which information describing the mutually similar patterns of data bits and/or data symbols is stored. This chronological sequence of duplication symbol values is optionally stored in one or more data servers and/or data storages. These data servers and/or data storages are optionally accessible to one or more decoders that are compatible with the encoder, for subsequently decoding the encoded data (D2). Such a chronological sequence is capable of reducing computation effort required, and therefore resulting in faster encoding and decoding of data.

Optionally, the encoder is operable to communicate the duplication symbols embedded within the encoded data (D2). Alternatively, the encoder is optionally operable to communicate the duplication symbols as a separate data stream to that of the encoded data (D2).

Optionally, the encoder is operable to compress data corresponding to at least one of: one-or-multi-dimensional audio data, image data, and/or video data, sensor data, economic data, measurement data, seismographic data, analog-to-digital converted data, transform coefficient data, transformed, processed or partial data, biomedical signal data, genomic data, DNA data, RNA data, textural data, calendar data, mathematical data, and binary data, but not limited thereto.

Furthermore, embodiments of the present disclosure also provide a decoder for decoding the encoded data (D2) to generate corresponding decoded data (D3). The decoder is operable to identify the duplication symbols included in the encoded data (D2) indicative of one or more duplicate reoccurrences of mutually similar multi-dimensional patterns of data bits and/or data symbols. The decoder is then operable to replace the duplication symbols with corresponding multi-dimensional patterns of data bits and/or data symbols to generate the decoded data (D3).

Optionally, the decoder is operable to use true and false bits as the duplication symbols, when only one alternative for duplication is available.

Optionally, the decoder is operable to fetch the duplicated multi-dimensional patterns of data bits and/or data symbols from the data servers and/or data storages. Alternatively, optionally, the decoder is operable to regenerate the duplicated multi-dimensional patterns of data bits and/or data symbols from corresponding mutually similar multi-dimensional patterns of data bits and/or data symbols included at least once in the encoded data (D2).

Optionally, the encoder and/or the decoder are arranged to function as elements of at least one of: a video codec, an audio codec, an image codec and/or a data codec, but not limited thereto.

Referring now to the drawings, particularly by their reference numbers, FIG. 1 is a schematic illustration of an example network environment 100 that is suitable for practicing embodiments of the present disclosure. The network environment 100 includes an encoder 102 and one or more electronic devices, depicted as an electronic device 104 in FIG. 1. The network environment 100 also includes a communication network 106, and one or more data servers and/or data storages and one or more databases, depicted as a data server and/or data storage 108 and a database 110 in FIG. 1. Additionally, the network environment 100 includes a decoder 112 and one or more computing devices, depicted as a computing device 114 in FIG. 1.

The network environment 100 is optionally implemented in various ways, depending on various possible scenarios. In one example scenario, the network environment 100 is implemented by way of a spatially collocated arrangement of the data server and/or data storage 108 and the database 110. In another example scenario, the network environment 100 is implemented by way of a spatially distributed arrangement of the data server and/or data storage 108 and the database 110 coupled mutually in communication via the communication network 106 or via a direct connection. In yet another example scenario, the data server and/or data storage 108 and the database 110 are implemented via cloud computing services. Optionally, the cloud computing services are provided in a peer-to-peer (P2P) manner.

The data server and/or data storage 108 is coupled in communication with the encoder 102 and the decoder 112 via the communication network 106 or via a direct connection. The communication network 106 is optionally a collection of individual networks, interconnected with each other and functioning as a single large network. Such individual networks are optionally wired, wireless, or a combination thereof. Examples of such individual networks include, but are not limited to, Local Area Networks (LANs), Wide Area Networks (WANs), Metropolitan Area Networks (MANs), Wireless LANs (WLANs), Wireless WANs (WWANs), Wireless MANs (WMANs), the Internet, second generation (2G) telecommunication networks, third generation (3G) telecommunication networks, fourth generation (4G) telecommunication networks, and Worldwide Interoperability for Microwave Access (WiMAX) networks.

The electronic device 104 provides the encoder 102, either directly or through the communication network 106, input data (D1) as an input. The input data (D1) may, for example, include at least one of: sensor data, one-or-multi-dimensional audio data, image data, video data and/or other types of data, for example as aforementioned. In an example, the electronic device 104 may be an Internet Protocol (IP) camera that may be operable to provide the encoder 102 with sensor data as sensed by one or more image sensors included within the IP camera. The sensor data may, for example, include one-or-multi-dimensional image data and/or video data and/or other types of data. Optionally, the Internet Protocol (IP) camera is employed for implementing a remote surveillance system, for example for detecting intruders and/or for detecting hazardous events, for example fires, flooding, and similar.

It will be appreciated here that the encoder 102 may be implemented as a part of the electronic device 104. In an example, the electronic device 104 may be an image and/or video capturing device that generates large quantities of image and/or video data, wherein lossless compression is desired so as to preserve fine information in the image and/or video data, whilst rendering the quantities of the image and/or video data manageable for data storage purposes. Examples of such image and/or video capturing devices include, but are not limited to, surveillance cameras, video recorders, X-ray devices, Magnetic Resonance Imaging (MRI) scanners, and ultrasound scanners. The electric device 104 is beneficially implemented using reduced instruction set computer (RISC) processors which are capable of performing data manipulations associated with methods of the present disclosure in a highly efficient manner, while simultaneously being very energy efficient.

Alternatively, the encoder 102 may be implemented independently, for example, using computing hardware that is operable to execute one or more software products recorded on machine-readable non-transient data storage media for compressing the input data (D1) to generate corresponding encoded data (D2).

Upon receiving the input data (D1) from the electronic device 104, either directly or through communication network 106, the encoder 102 is operable to process the input data (D1) to identify reoccurrence of mutually similar patterns of data bits and/or data symbols therein. The encoder 102 is then operable to represent one or more duplicate reoccurrences of the mutually similar patterns of data bits and/or data symbols by way of one or more duplication symbols uniquely identifying the mutually similar patterns. In order to identify previously-occurred patterns of data bits and/or data symbols, the encoder 102 is optionally operable to employ one or more redundancy checks. For this purpose, the encoder 102 is optionally operable to divide the input data (D1) into a plurality of data blocks and/or data packets of data bits and/or data symbols; optionally, both dividing and/or combining of data blocks and/or data packets of data bits is employed. In a first example, the input data (D1) is one-dimensional, and can be divided using scan-lines. In a second example, the input data (D1) is multi-dimensional, and can be divided into blocks, depending on a number of dimensions the blocks have.

In this regard, the encoder 102 is beneficially useable with other known encoders, for example, in conjunction with a block encoder as described in a published UK patent application no. GB 2503295 (A) incorporated herein by reference. The block encoder can be used to divide, in an optimal manner, the input data (D1) into the plurality of data blocks and/or data packets; optionally, combining of data blocks and/or data packets in the input data (D1) is also employed, for example after splitting has been implemented. In the first example where the input data (D1) is one-dimensional, the data blocks are extracted from the input data (D1) by cutting an incoming stream, namely, a byte-string, into shorter streams. For example, indices of pixels in a 6×4 image obtained after a regular scanning, namely, scanning first from left to right and then from top to bottom, is conveniently represented as follows:
01 02 03 04 05 06
07 08 09 10 11 12
13 14 15 16 17 18
19 20 21 22 23 24

These indices, when delivered in one-dimensional form for deduplication, yield a byte string, which is susceptible to being represented as follows:
01 02 03 04 05 06 07 08 09 10 11 12 13 14 15 16 17 18 19 20 21 22 23 24

The byte string is, for example, optionally split into shorter byte-strings of four bytes, which are susceptible to being represented as follows:
(01 02 03 04)
(05 06 07 08)
(09 10 11 12)
(13 14 15 16)
(17 18 19 20)
(21 22 23 24)

In the second example, it is assumed that the input data (D1) is a two-dimensional (2D) image. In this example, the 2D image is optionally divided into smaller 2×2 areas, and indices of pixels in the 2D image are optionally reorganized as byte-strings of four bytes by using a regular scanning order on the 2×2 areas of the 2D image. These byte-strings are optionally represented as follows:
(01 02 07 08)
(03 04 09 10)
(05 06 11 12)
(13 14 19 20)
(15 16 21 22)
(17 18 23 24)

Furthermore, in some examples, the input data (D1) is three-dimensional (3D). In other examples, there are more dimensions in the input data (D1), for example, such as time in videos. It will be appreciated here that a deduplication process is not executed in an order in which the input data (D1) has arrived via scanning or reading of a camera feed. Instead, the deduplication process takes into account dimensions of the input data (D1), namely, the deduplication process is executed in different dimensions of the input data (D1) in such a manner that duplication symbol values of nearby data blocks are located closer to each other.

The next three examples illustrate how the embodiments of the disclosure can reorder the data into blocks to be compressed more efficiently.

Figure 6A:
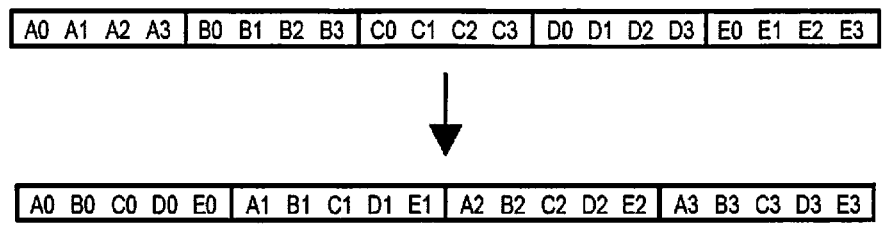
FIGS. 6A, 6B, 6C and 6D are illustrations of other example data transformations when implementing embodiments of the present disclosure In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

In a first example, in FIG. 6A, there is provided an illustration of how reordering of data for a stream of one-dimensional (mono) audio samples is executed to enable more efficient data deduplication. The samples are split into blocks so that given bits with identical location inside a given sample, for example the least significant bits (LSB) in a Big-endian sample, constitute one block, next bits (for example the next higher-order bits after the LSB) constitute a next block, and so on to provide vertically reordered blocks. The deduplication method pursuant to the present disclosure is then executed on these vertical reordered blocks.

Figure 6B:
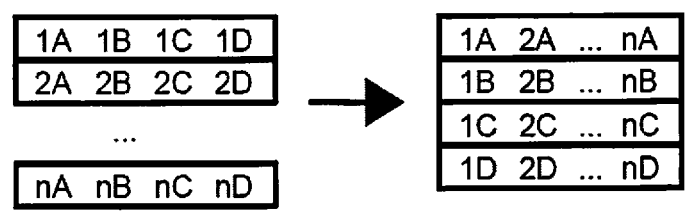
Figure 6C:
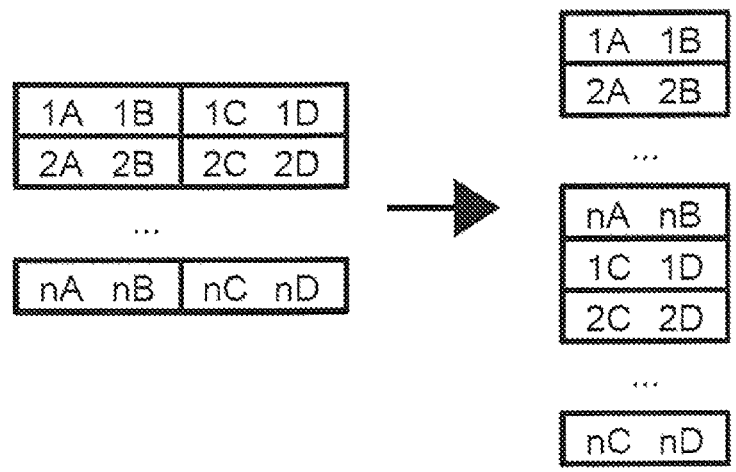

In the second example, FIG. 6B and FIG. 6C are illustrations of a scenario, wherein a stream of multi-channel audio samples can be reordered to enable more efficient deduplication. In FIG. 6B, the samples are reordered into blocks that contain samples from a mutually same time period, but from different channels. In FIG. 6C, the streams are split timewise into smaller blocks that contain samples from a short period of time from each channel separately, and then samples for a next time period from every channel separately, and so on.

Figure 6D:
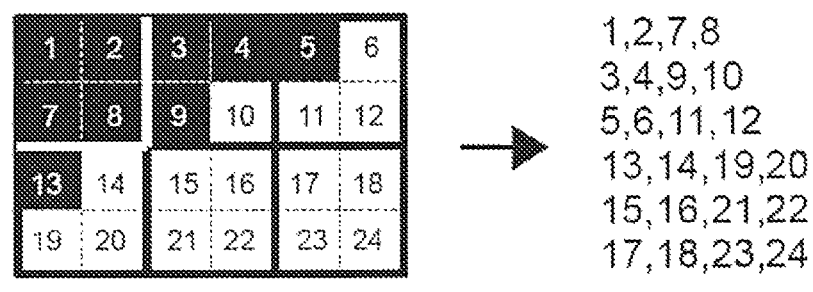

In the third example, FIG. 6D provides an illustration of reordering of image data so that instead of deduplicating an entire scanline or strip of an image, the image is reordered into two-dimensional blocks, and the strips (top-to-bottom or bottom-to-top) are processed inside such a block, namely block-by-block. The reordered data is then delivered, for example, so that the bottom-most sub-scanline of each block is transmitted serially first, then the sub-scanline on top of that, and so on.

As shown in examples above, likewise, when the input data (D1) is audio data, a similar deduplication process is optionally executed. In an example, the audio data optionally includes audio signals from multiple microphones. In such a case, the audio data is divided in a manner that individual audio signals are separated, and then further divided into data packets. The deduplication process is optionally then performed on these data packets. In another example, the deduplication process is susceptible to being used to deduplicate a particular audio string that reoccurs periodically in the audio data, such that in between the reoccurrences of that particular audio string there are other audio strings that have a different periodical recurrence pattern or that do not reoccur.

The encoder 102 is then optionally operable to compute one or more redundancy-check values for at least one data block and/or data packet from amongst the plurality of data blocks and/or data packets. These redundancy-check values can be computed using one or more suitable redundancy check methods. These redundancy-check values may, for example, be hash values that are computed using one or more hash functions.

In an example, a single long redundancy-check value is calculated for at least one data block and/or data packet of data bits and/or data symbols. In another example, multiple short redundancy-check values are calculated for at least one data block and/or data packet of data bits and/or data symbols.

The encoder 102 is then optionally operable to use a same duplication symbol to represent data blocks and/or data packets of data bits and/or data symbols whose corresponding redundancy checks match.

When a duplicate data block is found for a particular data block to be transmitted or written, the duplicate data block is validated against that particular data block to check whether or not the duplicate data block is same as that particular data block. If the duplicate data block is successfully validated against the particular data block, a duplication symbol referring to the particular data block is used to refer to the duplicate data block.

In case of a lossless compression, the duplicate data block is validated using a "MemoryCompare" functionality, wherein elements of the duplicate data block are compared with elements of the particular data block. The duplicate data block is considered invalid, even when only one of the elements of the duplicate data block does not match the elements of the particular data block.

In case of a lossy compression, absolute differences between the elements of the duplicate data block and the elements of the particular data block are computed. In an example, the duplicate data block is considered valid, if an indicator of distortions, for example, such as a sum of the absolute differences or a sum of squared differences is smaller than a predefined threshold value of a quality level set for the lossy compression.

Optionally, based on a duplication symbol, the location whereat the duplicated data can be obtained, for example its address, can be determined. Yet further, optionally, a duplication symbol includes a piece of information, for example an address, pointing to the duplicated data. In other words, such a piece of information can also be a pointer to an address instead of a direct address as to where that particular data block has been stored. Accordingly, the particular duplication symbol may be defined as a negative delta value of a chronological ordinal number of that particular data block or its sub-segment.

It will be appreciated that "deduplication" pursuant to the present disclosure is not the same as block matching, as employed in known art. For example, as described at the Wikipedia page http://en.wikipedia.org/wiki/Block-matching_algorithm, a block matching algorithm is a way of finding matching blocks in a sequence of digital video frames so as to enable a motion estimation kind of solution for intra-frame coding similarly as motion estimation is used for inter-frame coding. For example, as described in a paper "Lossless Layout Compression for Maskless Lithography Systems" by Vito Dai et al, available at http://www-video.eecs.berkeley.edu/papers/vdai/spie3997-51.pdf, block matching expresses the location of a block directly as coordinates. If a shift in relation to the coordinates of a given current block were expressed, then Y would always be negative and X could be either positive or negative. Moreover, the size of the block is expressed in both dimensions. In contrast, embodiments of the present disclosure employ, for example, fixed-sized blocks, and blocks are searched from the data only in certain locations, namely in equal-sized jumps.

Optionally, when only one alternative for duplication symbol is available, the encoder can use a true bit to describe that this one alternative is used for data deduplication and a false bit to describe that this one alternative is not used for data deduplication, namely when the original data is delivered.

Optionally, new duplication symbols are a decremented and/or incremented chronological sequence of duplication symbol values referring to a data storage, for example, such as a data file, in which information describing the mutually similar data blocks is stored.

There will next be described two examples which illustrate how the embodiments of the present disclosure use duplication symbols for uniquely determining the duplicated content of block by using location symbols, for example by employing a decremented chronological sequence, or by using table symbols, for example by employing an incremented chronological sequence. Both approaches can also be implemented by using pointers to define a first symbol of block content; the length of the content is known based on used block size.

Figure 5A:
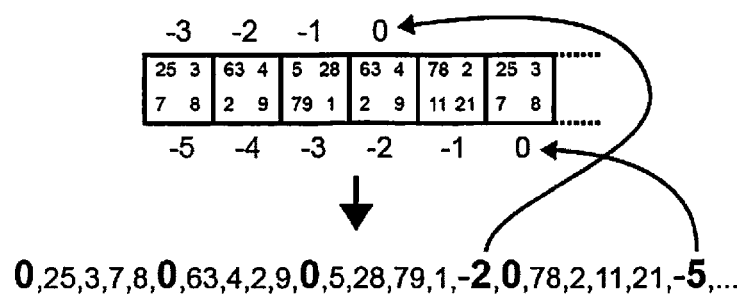
FIGS. 5A, 5B and 5C are illustrations of example data transformations when implementing embodiments of the present disclosure.

In a first example, there is shown in FIG. 5A an illustration of how data deduplication for a stream of data blocks is executed by employing location-based indexing, so that the data blocks which arrived prior to the current data block have negative indices, namely indicative of the earlier they came in relation to the current data block, the correspondingly larger the absolute value of the index. If a duplicate data block is found, the duplicate data block is not delivered further; in its place, the relative index is delivered instead.

Figure 5B:
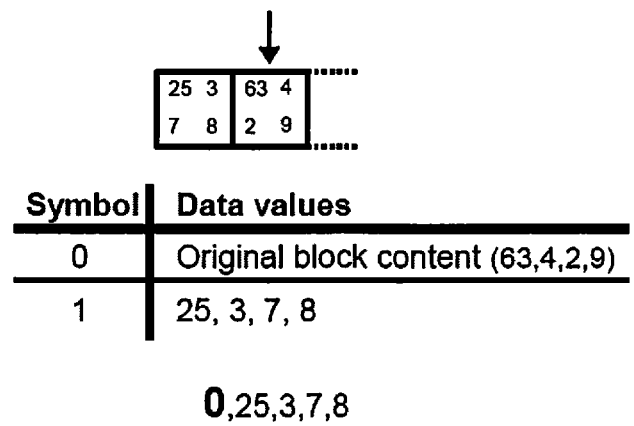
Figure 5C:
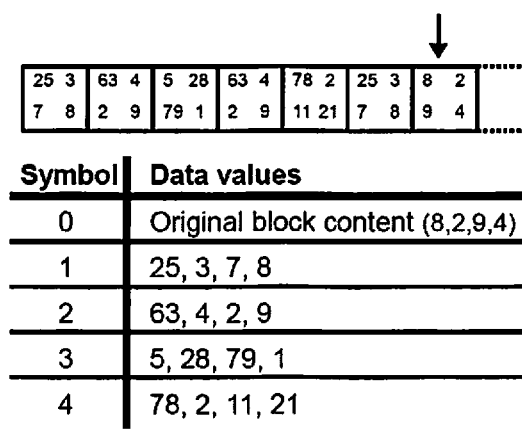

In the second example, there is shown in FIG. 5B and FIG. 5C illustrations of a case where the same stream of data blocks is indexed based on memory storage and using pointers; as the data blocks arrive, they are inserted into memory storage to a location indicated by a pointer value that is known based on index. Only new, not previously occurred blocks are delivered further in an associated execution chain as such; in place of duplicate blocks, only the index of pointer value referring to the block content is delivered.

Alternatively, optionally, a duplication symbol is set to a particular value, and new duplication symbols are used to represent offsets to that particular value. In such a case, both the particular value and the offsets are communicated.

The encoder 102 communicates the duplication symbol values to the data server and/or data storage 108 for storing in the database 110. The data server and/or data storage 108 is arranged to be accessible to the decoder 112, which is beneficially compatible with the encoder 102, for subsequently decoding the encoded data (D2).

Optionally, the duplication symbols can also refer to a future data block. This is particularly beneficial for improving a coding efficiency and delivery of data. If information of the future data block is valid, the decoder 112 decodes the encoded data (D2) after receiving the information of the future data block from one source or another source.

Conversely, if the information of the future data block is not valid, such delivery of duplication symbols referring to future data blocks can be used for another purpose. In an example situation in which there is a long period of time until a duplicate data block occurs, namely, there is a certain period of time during which no duplicate data blocks occur. In the example situation, an exception can be made and a duplication symbol referring to a future data block can be transmitted in between the certain period of time, for example, at approximately a middle of the certain period of time. When the decoder 112 receives the duplication symbol referring to the future data block that has not yet occurred, the decoder 112 estimates a point in time when a next duplicate data block is expected to be received.

There will next be described another example situation in which a decision has been made that transmission of duplication symbols will commence at a second data block, namely, after a first data block is transmitted. In this example situation, a certain duplication symbol, which is indicative of a time when a first duplicate data block is expected to occur, can be transmitted in the first block.

In an embodiment, the encoder 102 is operable to communicate the duplication symbols embedded within the encoded data (D2). In an example, a duplication symbol value corresponding to a new data block can be placed before or after the new data block, for example, if an automatic increase or decrease of duplication symbol values is not implemented.

It will be appreciated that when the duplication symbols are embedded within the encoded data (D2) in a single data stream, the entropy coding can still identify an arrival of a new duplication symbol, and thereafter, use different coding tables, one for actual data blocks and/or data packets and another for their corresponding duplication symbols.

In another embodiment, the encoder 102 is operable to communicate the duplication symbols as a separate data stream to that of the encoded data (D2). Duplication symbols as well as encoded data can also be compressed, for example, by using range coding, Huffman coding, Delta coding, ODelta coding, RLE, SRLE, EM, or any other compression or entropy modification method or combination of methods. ODelta coding is a form of encoding which employs a combination of delta coding and wrap-around with a range of counter values. "SRLE" refers to Split-Run-Length Encoding which is disclosed, for example, in a granted patent U.S. Pat. No. 8,823,560B1, whereas "EM" refers to Entropy Modifier which is disclosed in a granted patent U.S. Pat. No. 8,754,791B1.

Optionally, when two separate data streams are used to communicate the duplication symbols and the encoded data (D2), a first of the two separate data streams includes all of original data blocks, namely, first occurrences of data blocks, and a second of the two separate data streams includes duplication symbols of all of the data blocks, including duplication symbols of both original and duplicate data blocks, in a sequence in which these data blocks are encountered in the input data (D1). Optionally, a predetermined duplication symbol, for example "null" ("0"), is assigned to those data blocks that have not been duplicated. In an example situation where all of the data blocks are new and have not been duplicated, the second of the two separate data streams is nullified. Therefore, the compression process does not cause any extraneous load for transmitting, as the first of the two separate data streams includes the original data blocks in a sequence in which they were encountered. In this example situation, the decoder 112 determines that no data blocks were duplicated, as no duplication symbols were transmitted or written.

In yet another embodiment, the encoder 102 is operable to include, within the encoded data (D2), reference addresses to the database 110 from where information describing mappings between the duplication symbols and their corresponding data blocks can be obtained.

In some examples, the decoder 112 is optionally operable to access the encoded data (D2) from the data server and/or data storage 108. In alternative examples, the encoder 102 is optionally operable to stream the encoded data (D2) to the decoder 112, either via the communication network 106 or via a direct connection. Moreover, it is to be noted that a device equipped with a hardware or software encoder is capable of communicating directly with another device equipped with a hardware or software decoder. In yet other alternative examples, the decoder 112 may be implemented so as to retrieve the encoded data (D2) from machine-readable non-transient data storage media, such as a hard drive and a Solid-State Drive (SSD).

When required, the decoder 112 decodes the encoded data (D2) to generate corresponding decoded data (D3). In order to decode the encoded data (D2), the decoder 112 is operable to identify the duplication symbols included in the encoded data (D2) indicative of one or more duplicate reoccurrences of mutually similar data blocks. The decoder 112 is then operable to replace the duplication symbols with corresponding data blocks.

Optionally, the decoder is operable to use true and false bits as the duplication symbols, when only one alternative for duplication symbol is available.

In an embodiment of the present disclosure, the decoder 112 is operable to regenerate the duplicated data blocks from corresponding data blocks included at least once in the encoded data (D2). This may, for example, be applicable to a situation, where the duplication symbols are embedded within the encoded data (D2).

In another embodiment of the present disclosure, the decoder 112 is operable to fetch the duplicated data blocks from the data server and/or data storage 108. This may, for example, be applicable to another situation, where the duplication symbols are communicated as a separate data stream to that of the encoded data (D2).

In yet another embodiment of the present disclosure, the encoder 102 and the decoder 112 maintain their own duplication data storages that are accessible locally. These duplication data storages are optionally updated from time to time to be in synchronization, namely "sync", with the data server and/or data storage 108. In an example, a duplication data storage of the encoder 102 is implemented by way of a local database and/or a data memory associated with the encoder 102, depicted as a local database 116 in FIG. 1. A duplication data storage of the decoder 112 is beneficially implemented by way of a local database and/or a data memory associated with the encoder 112, depicted as a local database 118 in FIG. 1.

Subsequently, the decoder 112 is optionally operable to send the decoded data (D3) to the computing device 114. Examples of the computing device 114 include, but are not limited to, mobile phones, smart telephones, Mobile Internet Devices (MIDs), tablet computers, Ultra-Mobile Personal Computers (UMPCs), phablet computers, Personal Digital Assistants (PDAs), web pads, Personal Computers (PCs), handheld PCs, laptop computers, desktop computers, large-sized touch screens with embedded PCs, and interactive entertainment devices, such as game consoles, video players, Television (TV) sets, Set-Top Boxes (STBs), scientific measuring apparatus, seismic apparatus and medical sensing apparatus.

It is to be noted here that the decoder 112 may be implemented as a part of the computing device 114. Alternatively, the decoder 112 may be implemented independently, for example, using computing hardware that is operable to execute one or more software products recorded on machine-readable non-transient data storage media for decoding the encoded data (D2).

Optionally, the encoder 102 and/or the decoder 112 is arranged to function as elements of at least one of: a video codec, an audio codec, an image codec, and/or a data codec, but not limited thereto.

FIG. 1 is merely an example, which should not unduly limit the scope of the claims herein. It is to be understood that the specific designation for the network environment 100 is provided as an example and is not to be construed as limiting the network environment 100 to specific numbers, types, or arrangements of encoders, electronic devices, decoders, computing devices, data servers and/or data storages, databases and communication networks. A person skilled in the art will recognize many variations, alternatives, and modifications of embodiments of the present disclosure.

Figure 2:
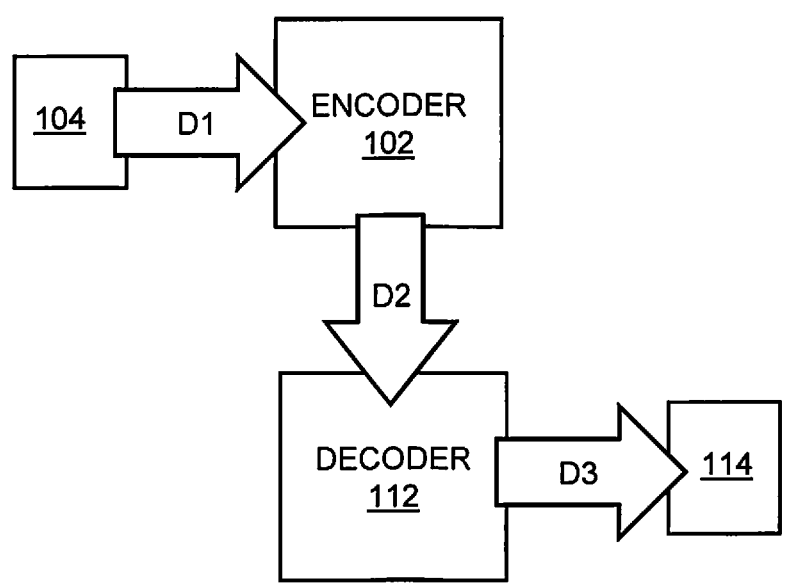
FIG. 2 is illustration of an example data flow, in accordance with an embodiment of the present disclosure.

FIG. 2 is an illustration of an example data flow, in accordance with an embodiment of the present disclosure. For illustration purposes, there is considered that the electronic device 104 is an IP camera that has been installed in a server room to monitor unauthorized activity. Moreover, there is also considered that a video-surveillance footage generated by the electronic device 104 is being streamed to the computing device 114 so as to be viewed by a user associated therewith.

In the example data flow, the input data (D1) is an original video-surveillance footage captured by the IP camera. The input data (D1) is typically large in size, and therefore, requires a large space for data storage in the database 110 and a large network bandwidth for data transfer over the communication network 106 or over a direct connection. Moreover, the server room may be accessed at a certain time of a day, and may have less human activity during other times of the day. Therefore, the input data (D1) is likely to have several duplicate image frames in the original video-surveillance footage during the other times of the day.

In order to encode the input data (D1) to the encoded data (D2), the encoder 102 analyzes content, type and/or composition of the input data (D1), and divides the input data (D1) into a plurality of data blocks. Optionally, the data blocks may be rectilinear in relation to areas of image frames represented by these data blocks, for example, 64×64 elements, 32×16 elements, 4×20 elements, 10×4 elements, 1×4 elements, 3×1 elements, 8×8 elements, 1×1 element and so on. However, it is to be noted here that other shapes of data blocks can be employed, for example, such as triangular, hexagonal, elliptical and circular. Moreover, the term 'data block' may refer to a data block as well as data segments included within the data block, throughout the present disclosure; for example, the input data (D1) corresponds to an image of billowing smoke or flames, or turbulent water flow, which include multiple curved image components that are inefficiently represented by rectilinear data blocks, but map efficiently onto elliptical and circular elements, thereby providing potentially a high degree of data compression.

Optionally, each of the plurality of data blocks may optionally have a predefined, namely fixed, size. The predefined size may be either user-defined or system-defined by default. The predefined size may, for example, be defined by the encoder 102 based on the analysis of the content, type and/or composition of the input data (D1). Therefore, the size of the data blocks may be either known to the decoder 112 or transmitted only once to the decoder 112.

It will be appreciated that using data blocks having a certain size/measurement/structure, embodiments of the present disclosure are able to conduct the search much faster and more simply; moreover, there is not even a need to express and deliver the length of the data, but instead it is sufficient to express/deliver the mere offset/reference.

Next, the encoder 102 computes one or more redundancy-check values for a first data block. Additionally, the encoder 102 optionally populates one or more redundancy-check value tables, corresponding to one or more redundancy check methods used, with the corresponding redundancy-check values and a duplication symbol assigned to the first data block uniquely.

Likewise, the encoder 102 computes one or more redundancy-check values for subsequent data blocks, and optionally populates the redundancy-check value tables. Subsequently, the encoder 102 optionally looks up these redundancy-check values in the redundancy-check value tables to determine whether or not a previously-occurred data block has reoccurred.

As described earlier, a duplicate data block is checked for validity, before a duplication symbol is selected to be written or transmitted. For this purpose, absolute differences and/or squared differences between the duplicate data block and an original data block are computed. An error value is then computed as an indicator of distortions, for example, such as a sum of the absolute differences or a sum of the squared differences or a maximum value of the absolute differences. The duplicate data block is considered valid, if the error value is smaller than the pre-defined threshold value of the quality level set for the compression process.

If it is found that a previously-occurred data block has reoccurred, the encoder 102 reuses a unique duplication symbol previously assigned to the previously-occurred data block to represent duplicate reoccurrences of the previously-occurred data block.

If it is found that no previously-occurred data block has reoccurred, the encoder 102 assigns a new duplication symbol to a subsequent data block uniquely. Additionally, the encoder 102 optionally populates the redundancy-check value tables with the computed redundancy-check value and the new duplication symbol corresponding to the subsequent data block.

In this manner, the encoder 102 records the new duplication symbol for future use of the mutually similar data blocks and/or data packets as a decremented and/or incremented chronological sequence of duplication symbol values referring to a data block and/or data packet describing the content of stored and delivered data block. Subsequently, the encoder 102 delivers the data bits and/or data symbols of this data block and/or data packet to the decoder 112, which also does similar chronological increment of the new duplication symbol for future use of mutually similar data blocks and/or data packets.

In a first example, the encoder 102 may communicate the duplication symbols embedded within the encoded data (D2). In a second example, the encoder 102 may communicate the duplication symbols as a separate data stream. Let us assume that unique duplication symbols have been assigned in an order, namely, 'a', 'b', 'c', 'd', and so on.

For illustration purposes only, there will be next considered an example of the input data (D1), represented as following:

[A] [B] [A] [C] [A] [B] [A] [A] [C] [A] [C] [C] [A] [B] [C] [A] [B] [A] [A] [D] [C]

wherein

'[A]' represents a first unique data block and/or data packet;

'[B]' represents a second unique data block and/or data packet;

'[C]' represents a third unique data block and/or data packet; and

'[D]' represents a fourth unique data block and/or data packet.

In accordance with the aforementioned first example, the duplication symbols are beneficially embedded within the encoded data (D2), for example, with first occurrences of their corresponding data blocks. This is optionally represented as following:

x[A] x[B] a x[C] a b a a c a c c a b c a b a a x[D] c wherein

'a' represents a unique duplication symbol assigned to the first data block and/or data packet;

'b' represents a unique duplication symbol assigned to the second data block and/or data packet;

'c' represents a unique duplication symbol assigned to the third data block and/or data packet;

'd' represents a unique duplication symbol assigned to the fourth data block and/or data packet; and 'x' represents that a new unique data block is encountered.

In accordance with the aforementioned second example, the duplication symbols are beneficially communicated as a separate data stream with or without compression, which is susceptible to being represented as follows:

x x a x a b a a c a c c a b c a b a a x c

In the second example, an additional data stream including data block and/or data packets for the new duplication symbols is also communicated. This is susceptible to being represented as follows:

[A] [B] [C] [D]

Optionally, the additional data stream is arranged in a chronological sequence of first occurrences of the data blocks in the input data (D1).

Furthermore, upon receiving the encoded data (D2), the decoder 112 decodes the encoded data (D2) to generate corresponding decoded data (D3). For this purpose, the decoder 112 identifies the duplication symbols, either included in the encoded data (D2) or provided in a separate data stream, indicative of one or more duplicate reoccurrences of mutually similar data blocks. Thereafter, the decoder 112 replaces the duplication symbols with their corresponding data blocks.

Optionally, the decoder 112 regenerates duplicated data blocks from corresponding first occurrences of data blocks included at least once in the encoded data (D2). Alternatively, the decoder 112 optionally fetches the duplicated data blocks from the data server and/or data storage 108, whereat the encoder 102 optionally has stored the encoded data (D2). Yet alternatively, the decoder 112 optionally fetches the duplicated data blocks from the local database 118, which is in synchronizations, namely "sync", with the data server and/or data storage 108.

In this manner, the decoder 112 decodes the duplication symbols to regenerate a plurality of data blocks and/or data packets of data bits and/or data symbols.

Subsequently, the decoder 112 combines the plurality of data blocks and/or data packets so regenerated, to generate the decoded data (D3).

In this regard, the decoder 112 is beneficially useable with other known decoders, for example, in conjunction with a block decoder as described in a published UK patent application no. GB 2505169 (A) incorporated herein by reference. The block decoder can be used to combine the plurality of data blocks and/or data packets that are regenerated from the encoded data (D2), to generate the decoded data (D3).

Subsequently, the decoder 112 sends the decoded data (D3) to the computing device 114. Continuing from the aforementioned example of the data flow where the input data (D1) is the original video-surveillance footage, the user is presented the video-surveillance footage on a display screen of the computing device 114.

Moreover, the encoder 102 optionally streams the encoded data (D2) to the decoder 112, whilst concurrently encoding the input data (D1) in real time. This is particularly beneficial in a situation where source data is encoded at a multimedia server in real time for streaming to users, for example, for Internet-delivered multimedia services.

Furthermore, the encoder 102 optionally encodes the input data (D1) in a substantially lossless manner, in accordance with an embodiment of the present disclosure. Accordingly, the decoder 112 decodes the encoded data (D2) in a substantially lossless manner.

In accordance with another embodiment of the present disclosure, the encoder 102 encodes the input data (D1) in a lossy manner. In such a situation, the encoder 102 is operable to quantize the input data (D1) before computing the one or more redundancy-check values. This means that data blocks that differ only slightly from each other can also be recognized as duplicates, and therefore, can be represented by a same duplication symbol assigned to them.

Optionally, the encoder 102 is capable of adaptively varying a compression ratio between the input data (D1) and the encoded data (D2). For this purpose, the encoder 102 is optionally operable to quantize only some portions of the input data (D1), based on the analysis of the content, type and/or composition of the input data (D1). Consequently, the encoder 102 enables a near lossless compression, when desired.

FIG. 2 is merely an example, which should not unduly limit the scope of the claims herein. A person skilled in the art will recognize many variations, alternatives, and modifications of embodiments of the present disclosure.

For example, the encoder 102 may be implemented in a similar manner to encode audio data, wherein the audio data may be divided into a plurality of data packets and/or data sections for which one or more redundancy checks may be computed to identify mutually similar data packets and/or data sections. The term 'data packet and/or data section' is synonymous with the term 'data block and/or data packet', but pertains to audio rather than image and/or video data. Optionally, the encoder 102 is operable to concurrently encode audio data along with image and/or video data.

However, it will be appreciated that the encoder 102 may be used to encode other types of data in a similar manner, for example, including at least one of: economic data, measurement data, seismographic data, analog-to-digital converted data, transform coefficient data, transformed, processed or partial data, biomedical signal data, genomic data, RNA data, DNA data, textural data, calendar data, mathematical data, and binary data, but not limited thereto.

Moreover, the encoder 102 is optionally operable to compute a predefined number of redundancy checks on the data blocks. The predefined number may be either user-defined or system-defined by default. The predefined number may be defined as a numerical value ranging from one to $\log_2(x)$, where 'x' is a maximal amount of redundant data blocks that may occur in the input data (D1). For example, if the maximal amount is 1024, then the predefined number may be any numerical value ranging from one to 10.

Optionally, the encoder 102 performs at least two or more redundancy checks using at least two or more redundancy-check value tables, so that a probability of occurrence of an invalid duplicate data block is reduced. In an example, values of a redundancy-check value table can have a bit count of 16. This implies that the redundancy-check value table can express up to $2^{16}-1$ values. Such a redundancy-check value uses only two bytes of memory space.

Moreover, different redundancy-check values of a particular data block provide a direct index or a set of indices from their corresponding redundancy-check value tables to a same duplication symbol that could be utilized for that particular data block. For this purpose, for each duplication symbol, a corresponding redundancy-check value is computed for each redundancy-check value table that uses that duplication symbol. It is to be noted that zero or more duplication symbols can exist for each redundancy-check value in a given redundancy-check value table. Therefore, it is beneficial to have at least one duplication symbol for each redundancy-check value, while minimizing a number of duplication symbols per redundancy-check value.

In case of lossy compression, data block values are beneficially quantized before the redundancy-check values are computed for them. Moreover, each quality level is associated with its own redundancy-check value table, which points to a same duplication symbol for a given data block. In this case, an original data block is inserted into a first redundancy-check value table that corresponds to original data block values, and a second redundancy-check value table that corresponds to a current setting of the quality level. The first redundancy-check value table includes duplication symbol values computed from the original data block values, and therefore, corresponds to lossless compression. The second redundancy-check value table includes duplication symbol values computed from quantized data block values, and therefore, corresponds to lossy compression. Consequently, a bit count of the duplication symbol values of the second redundancy-check value table is smaller than that of the first redundancy-check value table.

The redundancy check methods used to compute redundancy-check values can be mathematical functions, calculation formulae, algorithms or pre-computed tables. A redundancy check method is suitably selected such that it is capable of producing a single, explicit and distinct numerical value, which stays within allowed boundaries and parameters of a redundancy-check value table. In other words, the redundancy check method should produce different redundancy-check values for different data blocks as often as possible.

Optionally, the encoder 102 may employ hash functions for computing these redundancy checks. A suitable hash function may be selected, so as to decrease a probability of two different data blocks generating a similar hash code (hereinafter referred to as a 'collision'). In case a collision occurs, the collision is regarded as a false positive result, namely, a data block that is needed to be delivered is different from a data block represented by a given duplication symbol. Accordingly, data blocks from which the collision occurred are compared to check whether or not these data blocks are similar.

A probability of occurrence of such false positive results can be greatly reduced by using at least two or more redundancy-check value tables. Optionally, one or more of following can be used as redundancy checks:
(I) hash functions,
(ii) cryptographic hash functions, and/or
(iii) encryption algorithms, such as Pretty Good Privacy (PGP).

Furthermore, embodiments of the present disclosure provide a codec including a combination of the encoder 102 and the decoder 112.

Figure 3A:
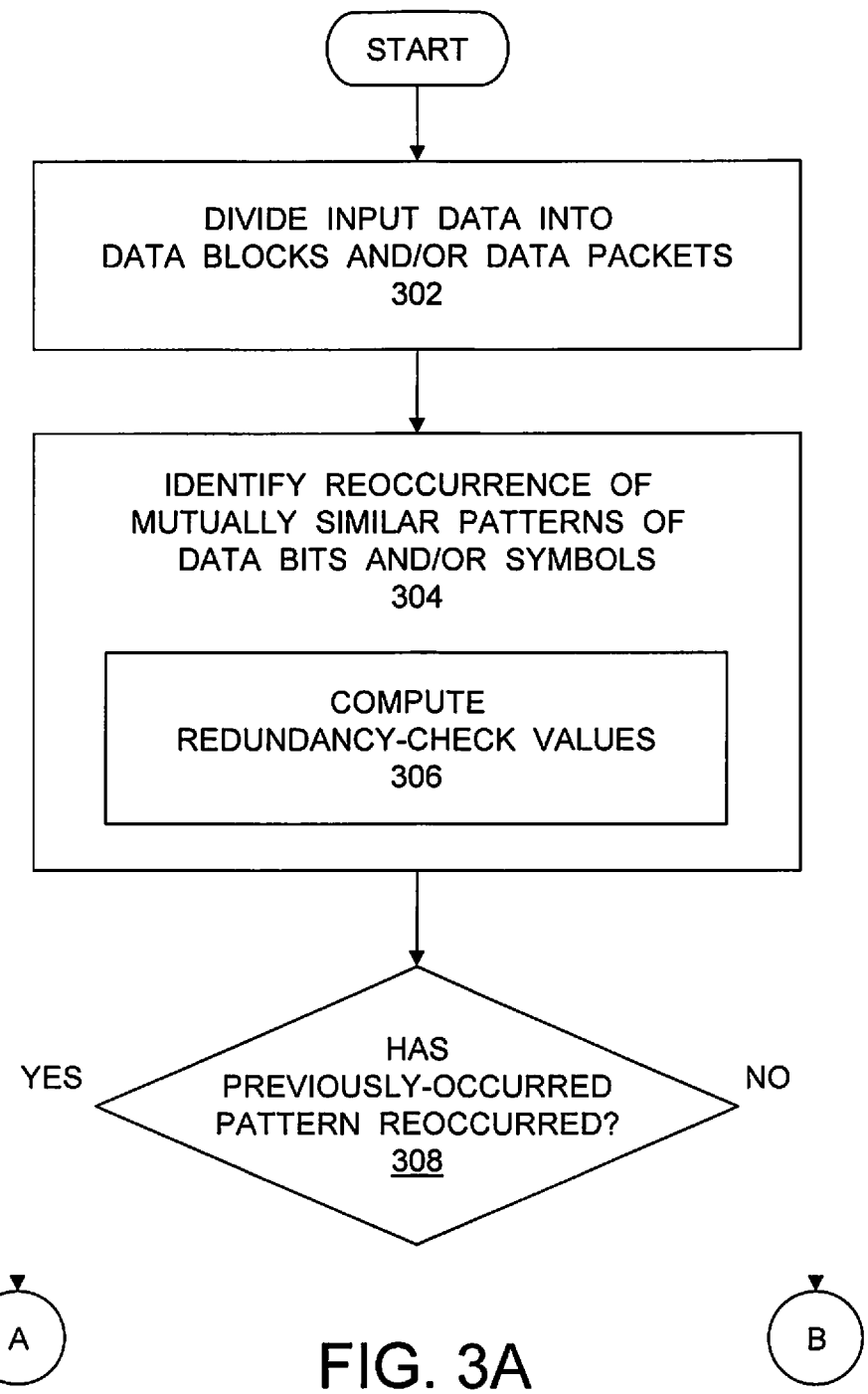
FIGS. 3A and 3B collectively are an illustration of steps of a method of compressing input data (D1) to generate corresponding encoded data (D2), in accordance with an embodiment of the present disclosure.
Figure 3B:
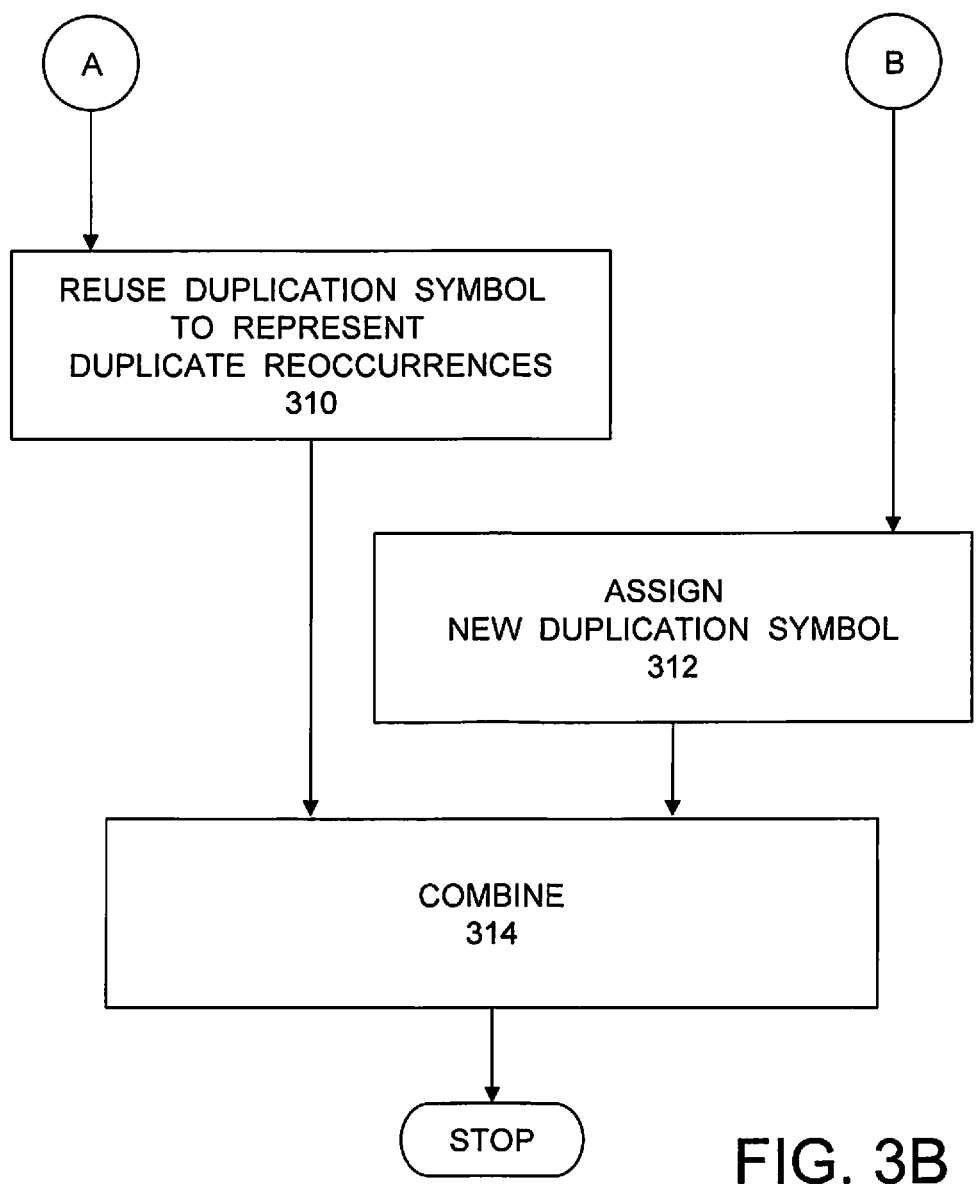

FIGS. 3A and 3B collectively are an illustration of steps of a method of compressing the input data (D1) to generate the corresponding encoded data (D2), in accordance with an embodiment of the present disclosure. The method is depicted as a collection of steps in a logical flow diagram, which represents a sequence of steps that can be implemented in hardware, software, or a combination thereof.

At a step 302, the encoder 102 divides the input data (D1) into a plurality of data blocks and/or data packets of data bits and/or data symbols.

At a step 304, the encoder 102 processes the plurality of data blocks and/or data packets to identify reoccurrence of mutually similar patterns of data bits and/or data symbols in the input data (D1).

The step 304 optionally includes a sub-step 306 at which the encoder 102 computes one or more redundancy-check values and redundancy-check value tables that are used to identify previously-occurred patterns of data bits and/or data symbols, as described earlier.

Next, at a step 308, the encoder 102 checks whether or not a previously-occurred pattern of data bits and/or data symbols has reoccurred. If, at the step 308, it is found that a previously-occurred pattern of data bits and/or data symbols has reoccurred, a step 310 is performed. Otherwise, if it is found that no previously-occurred pattern of data bits and/or data symbols has reoccurred, a step 312 is performed.

At the step 310, the encoder 102 reuses a duplication symbol, which was assigned to the previously-occurred pattern of data bits and/or data symbols initially, to represent one or more duplicate reoccurrences of the previously-occurred pattern of data bits and/or data symbols. In this manner, the encoder 102 represents duplicate reoccurrences of the mutually similar patterns of data bits and/or data symbols by way of the duplication symbols that uniquely identify these mutually similar patterns of data bits and/or data symbols.

At the step 312, the encoder 102 assigns a new duplication symbol to a new pattern of data bits and/or data symbols uniquely. Optionally, the new duplication symbol is susceptible to being represented as an offset to a duplication symbol value that was set previously.

In accordance with the step 312, the encoder 102 optionally populates redundancy-check value tables with the new duplication symbol and redundancy-check values corresponding to the new pattern of data bits and/or data symbols. Finally, at a step 314, the encoder 102 combines data obtained from the steps 310 and 312 into a single data stream or two separate data streams, as described earlier.

The steps 304 to 314 are performed for each pattern of data bits and/or data symbols.

In this manner, the encoder 102 generates the encoded data (D2) such that only mutually different patterns of data bits and/or data symbols are required to be stored and/or transmitted as mutually different data blocks and/or data packets, while duplication symbols are stored and/or transmitted for mutually similar patterns of data bits and/or data symbols.

Consequently, the encoded data (D2) is relatively small in size; and therefore, requires a small space for data storage in the database 110 and a small network bandwidth for data transfer over the communication network 106 or over a direct connection. Moreover, the encoded data (D2) includes less redundant information therein, and therefore, has smaller entropy sum for the entire data, but higher entropy value for the mutually different data blocks and/or data packets that have been delivered, as compared to the input data (D1). Here, the entropy is a measure of unpredictability of information content.

After the step 314, the encoder 102 optionally communicates the duplication symbols embedded within the encoded data (D2). Alternatively, optionally, the encoder 102 communicates the duplication symbols as a separate data stream and the mutually different data blocks and/or data packets as another data stream.

The steps 302 to 314 are only illustrative and other alternatives can also be provided where one or more steps are added, one or more steps are removed, or one or more steps are provided in a different sequence without departing from the scope of the claims herein.

Embodiments of the present disclosure provide a software product recorded on machine-readable non-transient data storage media, wherein the software product is executable upon computing hardware for implementing the method as described in conjunction with FIGS. 3A and 3B. The software product is optionally downloadable from a software application store, for example, from an "App store" to a computing device.

In an example, a software product may pertain to an example encoder that uses one redundancy check method to compute two redundancy-check values, wherein reused duplication symbols have dynamic values representing a negative block offset as illustrated below:

```
// Reset first and second hash codes for a data block
HashValue1 := 0;
HashValue2 := 0;
// Process all bytes through in the data block
PtrDst :=
@PByte(FBlockData.Memory)[(FBlockDataBitOffset + 7) div 8];
for Offset := 0 to FDataBlockSize - 1 do
begin
// Write byte already in place from source to destination
// if it is not detected as a redundant data block
PtrDst[Offset] := APtrSrc[Offset];
// Calculate first hash code for the data block
HashValue1 := (HashValue1 + APtrSrc[Offset]);
HashValue1 := (HashValue1 shl 10) + HashValue1;
HashValue1 := HashValue1 or (HashValue1 shr 6);
// Calculate second hash code for the data block
HashValue2 := (HashValue2 + APtrSrc[Offset]);
HashValue2 := HashValue2 or (HashValue2 shr 13);
HashValue2 := HashValue2 + (HashValue2 shl 3);
end;
// Find the data block number from the first hash table
DataBlockNumber1 := FHashTable1[HashValue1];
// Find the data block number from the second hash table
DataBlockNumber2 := FHashTable2[HashValue2];
// If a redundant data block is detected in both tables, then
write a negative delta
//encoded// duplication symbol for the redundant data block
and do not increment the data block offset to //cancel the
// change in destination memory
if (DataBlockNumber> 0) and (DataBlockNumber =
FHashTable2[HashValue2]) then
GurulogicVideoCodecLibUnit.SetNumber(PByte(FBlockSymbol.Memory),
FBlockSymbolBitOffset, (FDataBlockCount - DataBlockNumber) + 1)
// If the data block is not redundant, then write it into a raw table
else
begin
```

```
// Write constant zero duplication symbol for non-redundant data block
if (FDataBlockCount> 0) then
GurulogicVideoCodecLibUnit.SetNumber(PByte(FBlockSymbol.Memory),
FBlockSymbolBitOffset, $00);
// Write increment data block offset
Inc(FBlockDataBitOffset, FDataBlockBitSize);
// Increment count of total data blocks
Inc(FDataBlockCount, 1);
// Set the chronological data block number into the first hash table
FHashTable1[HashValue1] := FDataBlockCount;
// Set the chronological data block number into the second hash table
FHashTable2[HashValue2] := FDataBlockCount;
end;
```

In an alternative implementation, separate values for unique duplication symbols can be used, instead of a dynamic negative block offset. This potentially compresses duplication symbols more efficiently with an entropy encoder, for example, such as range coding, arithmetic coding, and Variable-Length Coding (VLC). It will be appreciated that whereas entropy coding methods compress very well such symbols that occur often, deduplication methods attempt to convert groups of data blocks and/or packets of data bits to such deduplication symbols that would be easier to be used as such, and optionally, also entropy encoded.

Figure 4:
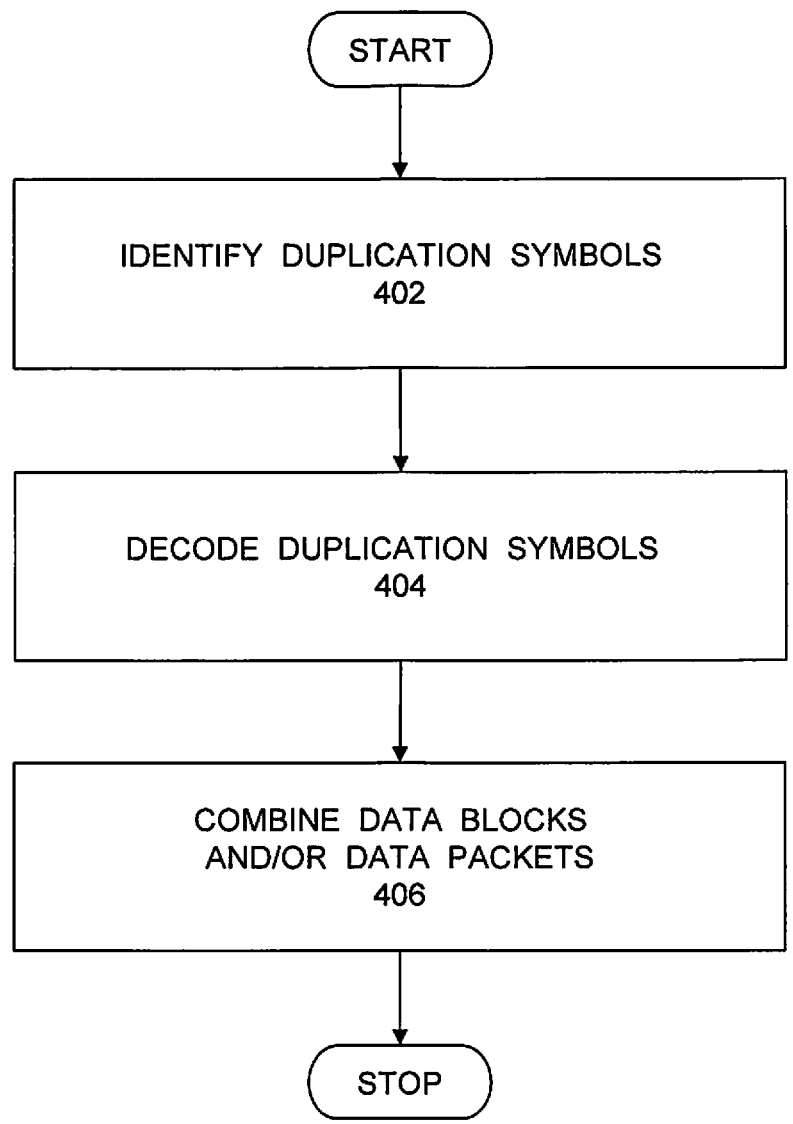
FIG. 4 is an illustration of steps of a method of decoding the encoded data (D2) to generate corresponding decoded data (D3), in accordance with an embodiment of the present disclosure.

FIG. 4 is an illustration of steps of a method of decoding the encoded data (D2) to generate corresponding decoded data (D3), in accordance with an embodiment of the present disclosure. The method is depicted as a collection of steps in a logical flow diagram, which represents a sequence of steps that can be implemented in hardware, software, or a combination thereof.

At a step 402, the decoder 112 processes the encoded data (D2) to identify one or more duplication symbols, either included in the encoded data (D2) or provided in a separate data stream, that is indicative of one or more duplicate reoccurrences of mutually similar patterns of data bits and/or data symbols.

Next, at a step 404, the decoder 112 decodes the duplication symbols to regenerate a plurality of data blocks and/or data packets of data bits and/or data symbols. For this purpose, the decoder 112 replaces the duplication symbols with their corresponding patterns of data bits and/or data symbols. In accordance with the step 404, the decoder 112 optionally regenerates the duplicated patterns of data bits and/or data symbols from corresponding mutually similar patterns of data bits and/or data symbols included at least once in the encoded data (D2). Alternatively, the decoder 112 optionally fetches the duplicated patterns of data bits and/or data symbols from the data server and/or data storage 108, whereat the encoder 102 may have stored the encoded data (D2). Yet alternatively, the decoder 112 optionally fetches the duplicated patterns of data bits and/or data symbols from the local database 118, which is in synchronization, namely "sync", with the data server and/or data storage 108.

Subsequently, at a step 406, the decoder 112 combines the plurality of data blocks and/or data packets regenerated at the step 404, to generate the decoded data (D3).

The steps 402 to 406 are only illustrative and other alternatives can also be provided where one or more steps are added, one or more steps are removed, or one or more steps are provided in a different sequence without departing from the scope of the claims herein.

Embodiments of the present disclosure provide a software product recorded on machine-readable non-transient data storage media, wherein the software product is executable upon computing hardware for implementing the method as described in conjunction with FIG. 4. The software product is optionally downloadable from a software application store, for example, from an "App store" to a computing device, such as the computing device 114.

In an example, a software product may pertain to an example decoder that is compatible with the example encoder as illustrated below:

```
// Set the negative delta duplication symbol to zero if processing the
first data block
if (ADataBlockCount = 0) then
NegativeDeltaSymbol := 0
// Read the negative delta duplication symbol if not processing the
first data block
elseNegativeDeltaSymbol :=
GurulogicVideoCodecLibUnit.GetNumber(PByte(FBlockSymbol.Memory),
FBlockSymbolBitOffset);
// Calculate the data block number if the negative delta duplication symbol
is not zero
if (NegativeDeltaSymbol> 0) then
DataBlockNumber := (ADataBlockCount – NegativeDeltaSymbol)
// Get the data block number if no redundant data block is found
else
begin
// Get data block index
DataBlockNumber :=ADataBlockCount;
// Increment the count of total data blocks
Inc(ADataBlockCount, 1);
end;
// Get the memory offset for the data block
FBlockData.Position := FDataBlockSize * DataBlockNumber;
// Read the data block from memory
FBlockData.Read(APtrData[0], FDataBlockSize);
```

Furthermore, embodiments of the present disclosure provide a codec including a combination of at least one encoder as described in conjunction with FIGS. 3A and 3B and at least one decoder as described in conjunction with FIG. 4.

Embodiments of the present disclosure are susceptible to being used for various purposes, including, though not limited to, enabling lossless or near lossless data compression of one-or-multi-dimensional image, video, audio and any other type of data with a high compression ratio.

Modifications to embodiments of the present disclosure described in the foregoing are possible without departing from the scope of the present disclosure as defined by the accompanying claims. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

We claim:

1. An encoder for compressing input data to generate corresponding encoded data, the encoder comprising:
   a data processor which is operable to:
      divide the input data into a plurality of data blocks or data packets of data bits or data symbols, the plurality of data blocks or data packets including multi-dimensional patterns of data bits or data symbols,
      process the plurality of data blocks or data packets to identify reoccurrence of mutually similar multi-dimensional patterns of data bits or data symbols in the input data, and
      represent one or more duplicate reoccurrences of the mutually similar multi-dimensional patterns of data bits or data symbols by way of one or more duplication symbols uniquely identifying the mutually similar multi-dimensional patterns, wherein the data processor is operable to generate the one or more duplication symbols as a decremented or incremented chronological sequence of duplication symbol values, wherein the data processor is operable to assign a same predetermined duplication symbol to data blocks that have not previously been duplicated, and wherein the sequence of duplication symbol values refers to a data file in which information describing the mutually similar multi-dimensional patterns of data bits or data symbols is stored.

2. The encoder as claimed in claim 1, wherein the plurality of data blocks or data packets comprise data blocks or data packets of fixed size.

3. The encoder as claimed in claim 1, wherein the chronological sequence of duplication symbol values is stored in one or more data servers or data storages.

4. The encoder as claimed in claim 3, wherein the one or more data servers or data storages are accessible to one or more decoders that are compatible with the encoder, for subsequently decoding the encoded data.

5. The encoder as claimed in claim 1, wherein the one or more data blocks or data packets of data bits or data symbols are represented by one or more corresponding alternative unique duplication-indicative symbols.

6. The encoder as claimed in claim 5, wherein the one or more corresponding unique duplication-indicative symbols are implemented as a previous data block, a previous data packet of data bits, or a constant value data block.

7. The encoder as claimed in claim 1, wherein the encoder is operable to communicate the one or more duplication symbols embedded within the encoded data.

8. The encoder as claimed in claim 1, wherein the encoder is operable to communicate the one or more duplication symbols as a separate data stream to that of the encoded data.

9. The encoder as claimed in claim 1, wherein the data processor is operable to compress data corresponding to at least one of: one-or-multi-dimensional audio data, image data, video data, sensor data, economic data, measurement data, seismographic data, transform coefficient data, transformed, processed or partial data, biomedical signal data, genomic data, RNA data, or DNA data.

10. The encoder as claimed in claim 1, wherein the encoder is arranged to function as an element of at least one of: a video codec, an audio codec, an image codec, or a data codec.

11. The encoder as claimed in claim 1, wherein the data processor is operable to compute one or more redundancy-check values that are used to identify previously-occurred multi-dimensional patterns of data bits or data symbols.

12. A method of compressing input data to generate corresponding encoded data, the method comprising:
employing a data processor of an encoder for:
(i) dividing the input data into a plurality of data blocks or data packets of data bits or data symbols, the plurality of data blocks or data packets including multi-dimensional patterns of data bits or data symbols;
(ii) processing the plurality of data blocks or data packets to identify reoccurrence of mutually similar multi-dimensional patterns of data bits or data symbols in the input data; and
(iii) representing one or more duplicate reoccurrences of the mutually similar multi-dimensional patterns of data bits or data symbols by way of one or more duplication symbols uniquely identifying the mutually similar multi-dimensional patterns, wherein the data processor is operable to generate the one or more duplication symbols as a decremented or incremented chronological sequence of duplication symbol values, wherein the data processor is operable to assign a same predetermined duplication symbol to data blocks that have not previously been duplicated, and wherein the sequence of duplication symbol values refers to a data file in which information describing the mutually similar multi-dimensional patterns of data bits or data symbols is stored.

13. The method as claimed in claim 12, further comprising utilizing data blocks or data packets of fixed size for the plurality of data blocks or data packets.

14. The method as claimed in claim 12, further comprising storing the chronological sequence of duplication symbol values in one or more data servers or data storages.

15. The method as claimed in claim 14, further comprising arranging for the one or more data servers or data storages to be accessible to one or more decoders that are compatible with the encoder, for subsequently decoding the encoded data.

16. The method as claimed in claim 12, further comprising communicating the one or more duplication symbols embedded within the encoded data.

17. The method as claimed in claim 12, further comprising communicating the one or more duplication symbols as a separate data stream to that of the encoded data.

18. The method as claimed in claim 12, further comprising compressing data corresponding to at least one of: one-or-multi-dimensional audio data, image data, video data, sensor data, economic data, measurement data, seismographic data, transform coefficient data, transformed, processed or partial data, biomedical signal data, genomic data, RNA data, or DNA data.

19. The method as claimed in claim 12, further comprising computing one or more redundancy-check values that are used to identify previously-occurred multi-dimensional patterns of data bits or data symbols.

20. A decoder for decoding encoded data to generate corresponding decoded data, comprising:
a data processor operable to:
identify one or more duplication symbols included in the encoded data indicative of one or more duplicate reoccurrences of mutually similar multi-dimensional patterns of data bits or data symbols, and
replace the one or more duplication symbols with corresponding multi-dimensional patterns of data bits or data symbols to generate the decoded data,
wherein the one or more duplication symbols are a decremented or incremented chronological sequence of duplication symbol values,
wherein a same predetermined duplication symbol is assigned to data blocks that have not previously been duplicated, and
wherein the sequence of duplication symbol values refers to a data file in which information describing the mutually similar multi-dimensional patterns of data bits or data symbols is stored.

21. The decoder as claimed in claim 20, wherein the decoder is operable to fetch the one or more duplicated multi-dimensional patterns of data bits or data symbols from one or more data servers or data storages.

22. The decoder as claimed in claim 20, wherein the data processor is operable to regenerate the one or more duplicated multi-dimensional patterns of data bits or data symbols from corresponding mutually similar multi-dimensional patterns of data bits or data symbols included at least once in the encoded data.

23. A method of decoding encoded data to generate corresponding decoded data, the method comprising:
(i) identifying one or more duplication symbols included in the encoded data indicative of one or more duplicate reoccurrences of mutually similar multi-dimensional patterns of data bits data symbols; and
(ii) replacing the one or more duplication symbols with corresponding multi-dimensional patterns of data bits or data symbols to generate the decoded data,
wherein the one or more duplication symbols are a decremented or incremented chronological sequence of duplication symbol values,
wherein a same predetermined duplication symbol is assigned to data blocks that have not previously been duplicated, and
wherein the sequence of duplication symbol values refers to a data file in which information describing the mutually similar multi-dimensional patterns of data bits or data symbols is stored.

24. The method as claimed in claim 23, further comprising fetching the one or more duplicated multi-dimensional patterns of data bits or data symbols from one or more data servers or data storages.

25. The method as claimed in claim 23, further comprising regenerating the one or more duplicated multi-dimensional patterns of data bits or data symbols from corresponding mutually similar multi-dimensional patterns of data bits or data symbols included at least once in the encoded data.

26. A computer program product comprising a non-transitory computer-readable storage medium having computer-readable instructions stored thereon, the computer-readable instructions being executable by a computerized device comprising processing hardware, which when executed by the computerized device causes the computerized device to execute the method as claimed in claim 12.

27. A computer program product comprising a non-transitory computer-readable storage medium having computer-readable instructions stored thereon, the computer-readable instructions being executable by a computerized device comprising processing hardware, which when executed by the computerized device causes the computerized device to execute the method as claimed in claim 23.

28. A codec including a combination of at least one encoder for compressing input data to generate corresponding encoded data, and at least one decoder for decoding the encoded data to generate corresponding decoded data, the codec comprising:
an encoder comprising a data processor which is operable to:
divide input data into a plurality of data blocks or data packets of data bits or data symbols, the plurality of data blocks or data packets including multi-dimensional patterns of data bits or data symbols,
process the plurality of data blocks or data packets to identify reoccurrence of mutually similar multi-dimensional patterns of data bits or data symbols in the input data, and
represent one or more duplicate reoccurrences of the mutually similar multi-dimensional patterns of data bits or data symbols by way of one or more duplication symbols uniquely identifying the mutually similar multi-dimensional patterns; and
an decoder operable to:
identify one or more duplication symbols included in the encoded data indicative of one or more duplicate reoccurrences of mutually similar multi-dimensional patterns of data bits or data symbols, wherein a same duplication symbol is used to represent multi-dimensional patterns of data bits or data symbols whose corresponding redundancy checks match, and
replace the one or more duplication symbols with corresponding multi-dimensional patterns of data bits or data symbols to generate the decoded data,
wherein the one or more duplication symbols are a decremented or incremented chronological sequence of duplication symbol values,
wherein a same predetermined duplication symbol is assigned to data blocks that have not previously been duplicated, and
wherein the sequence of duplication symbol values refers to a data file in which information describing the mutually similar multi-dimensional patterns of data bits or data symbols is stored.

* * * * *